(12) United States Patent
Shaeffer et al.

(10) Patent No.: US 10,971,201 B2
(45) Date of Patent: Apr. 6, 2021

(54) ON-DIE TERMINATION OF ADDRESS AND COMMAND SIGNALS

(71) Applicant: Rambus Inc., San Jose, CA (US)

(72) Inventors: Ian Shaeffer, Los Gatos, CA (US); Kyung Suk Oh, Cupertino, CA (US)

(73) Assignee: RAMBUS INC., San Jose, CA (US)

( * ) Notice: Subject to any disclaimer, the term of this patent is extended or adjusted under 35 U.S.C. 154(b) by 0 days.

(21) Appl. No.: 16/933,891

(22) Filed: Jul. 20, 2020

(65) Prior Publication Data

US 2020/0388310 A1  Dec. 10, 2020

Related U.S. Application Data

(63) Continuation of application No. 16/716,385, filed on Dec. 16, 2019, now Pat. No. 10,720,196, which is a
(Continued)

(51) Int. Cl.
*G11C 5/06* (2006.01)
*G11C 7/22* (2006.01)
(Continued)

(52) U.S. Cl.
CPC .............. *G11C 7/22* (2013.01); *G11C 5/063* (2013.01); *G11C 11/4063* (2013.01);
(Continued)

(58) Field of Classification Search
CPC ....... G11C 5/063; G11C 7/18; G11C 11/4097; G11C 5/205; G11C 5/04
(Continued)

(56) References Cited

U.S. PATENT DOCUMENTS 5,467,455 A   11/1995  Gay et al.
5,663,661 A    9/1997  Dillon et al.
(Continued)

FOREIGN PATENT DOCUMENTS

JP        02-140676        5/1990
WO    WO-1997-002658    1/1997
(Continued)

OTHER PUBLICATIONS

Elpida Memory, Inc., "512M bits DDR3 SDRAM," Preliminary Data Sheet, Document No. E0785E11, Ver. 1.1, Feb. 2006, www.elpida.com. 4 pages.
(Continued)

*Primary Examiner* — Jason Lappas
(74) *Attorney, Agent, or Firm* — Morgan, Lewis & Bockius LLP

(57) ABSTRACT

A system has a plurality of memory devices arranged in a fly-by topology, each having on-die termination (ODT) circuitry for connecting to an address and control (RQ) bus. The ODT circuitry of each memory device includes a set of one or more control registers for controlling on-die termination of one or more signal lines of the RQ bus. A memory controller sends register values, for storage in a plurality of registers of a respective memory device. The register values include register values that represent one or more impedance values of on-die termination (ODT) impedances to apply to the respective inputs of the respective memory device that receive the CA signals, and one or more register values to selectively enable application of a chip select ODT impedance to the chip select input of the respective memory device.

20 Claims, 5 Drawing Sheets

Related U.S. Application Data continuation of application No. 16/174,180, filed on Oct. 29, 2018, now Pat. No. 10,510,388, which is a continuation of application No. 15/665,304, filed on Jul. 31, 2017, now Pat. No. 10,115,439, which is a continuation of application No. 15/394,009, filed on Dec. 29, 2016, now Pat. No. 9,721,629, which is a continuation of application No. 15/081,745, filed on Mar. 25, 2016, now Pat. No. 9,570,129, which is a continuation of application No. 14/613,270, filed on Feb. 3, 2015, now Pat. No. 9,299,407, which is a continuation of application No. 14/088,277, filed on Nov. 22, 2013, now Pat. No. 8,947,962, which is a continuation of application No. 12/519,908, filed as application No. PCT/US2007/088245 on Dec. 19, 2007, now Pat. No. 8,599,631.

(60) Provisional application No. 60/876,672, filed on Dec. 21, 2006.

(51) Int. Cl.
| | |
|---|---|
| G11C 29/02 | (2006.01) |
| G11C 11/4063 | (2006.01) |
| G11C 5/04 | (2006.01) |
| G11C 11/4097 | (2006.01) |
| G11C 7/18 | (2006.01) |
| G11C 5/02 | (2006.01) |

(52) U.S. Cl.
CPC ............ *G11C 29/02* (2013.01); *G11C 29/022* (2013.01); *G11C 29/025* (2013.01); *G11C 29/028* (2013.01); *G11C 5/025* (2013.01); *G11C 5/04* (2013.01); *G11C 5/06* (2013.01); *G11C 7/18* (2013.01); *G11C 11/4097* (2013.01)

(58) Field of Classification Search
USPC ..................................... 365/201, 82, 63, 222
See application file for complete search history.

(56) References Cited

U.S. PATENT DOCUMENTS

| | | | |
|---|---|---|---|
| 5,666,078 | A | 9/1997 | Lamphier et al. |
| 5,995,894 | A | 11/1999 | Wendte |
| 6,060,907 | A | 5/2000 | Vishwanthaiah et al. |
| 6,157,206 | A | 12/2000 | Taylor et al. |
| 6,308,232 | B1 | 10/2001 | Gasbarro |
| 6,356,105 | B1 | 3/2002 | Volk |
| 6,356,106 | B1 | 3/2002 | Greef et al. |
| 6,538,951 | B1 | 3/2003 | Janzen et al. |
| 6,781,405 | B2 | 8/2004 | Rajan et al. |
| 6,834,014 | B2 | 12/2004 | Yoo et al. |
| 6,856,169 | B2 | 2/2005 | Frans et al. |
| 6,871,253 | B2 | 3/2005 | Greeff et al. |
| 6,894,691 | B2 | 5/2005 | Juenger |
| 6,924,660 | B2 | 8/2005 | Nguyen et al. |
| 6,965,529 | B2 | 11/2005 | Zumkehr et al. |
| 6,980,020 | B2 | 12/2005 | Best et al. |
| 7,102,200 | B2 | 9/2006 | Fan et al. |
| 7,123,047 | B2 | 10/2006 | Lim |
| 7,142,461 | B2 | 11/2006 | Janzen |
| 7,148,721 | B2 | 12/2006 | Park |
| 7,155,627 | B2 | 12/2006 | Matsui |
| 2002/0144166 | A1 | 10/2002 | Chang et al. |
| 2003/0043681 | A1 | 3/2003 | Janzen et al. |
| 2003/0043683 | A1 | 3/2003 | Funaba et al. |
| 2004/0100837 | A1 | 5/2004 | Lee |
| 2004/0201402 | A1 | 10/2004 | Rajan et al. |
| 2004/0228196 | A1 | 11/2004 | Kwak et al. |
| 2005/0212551 | A1 | 9/2005 | So et al. |
| 2005/0225353 | A1 | 10/2005 | Kwon |
| 2005/0228912 | A1 | 10/2005 | Walker et al. |
| 2006/0007761 | A1 | 1/2006 | Ware et al. |
| 2006/0071683 | A1 | 4/2006 | Best et al. |
| 2006/0077731 | A1 | 4/2006 | Ware et al. |
| 2006/0091900 | A1 | 5/2006 | Kang et al. |
| 2006/0107186 | A1* | 5/2006 | Cowell ............... G11C 29/1201 714/776 |
| 2006/0146627 | A1 | 7/2006 | Park et al. |
| 2007/0007992 | A1 | 1/2007 | Bains et al. |
| 2007/0070717 | A1 | 3/2007 | Kim |

FOREIGN PATENT DOCUMENTS

| | | |
|---|---|---|
| WO | WO-1998-004041 | 1/1998 |
| WO | WO-2000-041300 | 7/2000 |
| WO | WO-2000-070474 | 11/2000 |
| WO | WO-2004-061690 A3 | 7/2004 |
| WO | WO-2005-119471 | 12/2005 |

OTHER PUBLICATIONS

Farrell, Todd, "Core Architecture Doubles MEM Data Rate," in Electronic Engineering Times Asia, Dec. 16, 2005. 4 pages.
Gervasi, Bill, "DRAM Module Market Overview," SimpleTech, JEDEX Shanghai, Oct. 25-26, 2005. 50 pages.
Hynix Semiconductor, "JEDEX Shanghai 2005," Oct. 2005. 24 pages.
International Preliminary Report on Patentability dated Jul. 2, 2009, for International Application No. PCT/US2007088245 with Filing Date Dec. 19, 2009. 9 pages.
International Search Report and Written Opinion issued in PCT/US2007/088245, dated Jun. 2, 2008, 12 pages by ISA/EP.
Janzen, Jeff, "DDR2 Offers New Features and Functionality," Designline, vol. 12, Issue 2, Micron, Jul. 31, 2003, EN.L. 16 pages.
Johnson, Chris, "Graphics DDR3 On-Die Termination and Thermal Considerations," Micron Designline, vol. 12, Issue 1, Rev. Apr. 1, 2003, 1Q03/2Q03. 8 pages.
Johnson, Chris, "The Future of Memory: Graphics DDR3 SDRAM Functionality," Micron Designline, vol. 11, Issue 4, 4Q02, Oct. 2002. 8 pages.
Lee, K.H., "MultiMediaCard Solutions of Digital Storage Applications," Samsung Electronics, JEDEX Shanghai, Oct. 26, 2005. 28 pages.
Micron Technical Note, "DDR2-533 Memory Design Guide for Two-DIMM Unbuffered Systems," TN-47-01, 2003. 19 pages.
Micron Technical Note, "TN-47-07: DDR2 Simulation Support," Rev. A 7/05, 2003. 4 pages.
Rhoden et al., "DDR/DDR2/DDR3 SDRAM Tutorial," Oct. 25-26, 2005, Slide Presentation. 118 pages.
Rhoden, Desi, "VTF 2005: The Evolution of DDR," Via Technology Forum 2005, Inphi Corporation, JEDEC 42 Memory Committee. 23 pages.
Samsung Electronics, "512Mb E-die DDR3 SDRAM Specification," Preliminary 512Mb DDR3 SDRAM, Rev. 0.5, Dec. 2006, K4B510846E. 55 pages.
Samsung Electronics, "DDR2 ODT Control," Product Planning & Application Engineering Team, Dec. 2004. 8 pages.
Shen, Dr. William Wu, "DDR3 Functional Outlook," Infineon, JEDEX Shanghai, Oct. 25-26, 2005, JEDEC 42.3B Letter Committee, Functional and Features. 30 pages.
Shen, Dr. William Wu, "DDR3 Functional Outlook," JEDEX San Jose, Apr. 2006, JEDEC 42.3B Letter Committee, Functional and Features. 31 pages.
Shen, Dr. William Wu, "System Challenges on DDR3 High Speed Clock/Address/Command Fly-by Bus Topology," JEDEX San Jose, Apr. 18, 2006. 47 pages.
Trost, Dr. Hans-Peter, "Press Presentation DDR3 Introduction," Memory Products Group, Infineon Technologies, AG, Jun. 2005. 11 pages.
Weidlich, Rainer, "What Comes Next in Commodity DRAMS—DDR3," Infineon Technologies, Jun. 2005. 4 pages.

\* cited by examiner

| CAODTEN | CAODT | ALT CAODT | |
|---|---|---|---|
| VSSQ (Disable) | D/C | D/C | Termination Off |
| VDDQ (Enable) | I | O | Nominal Z |
| | O | I | Alternate Z |
| | O | O | High Z |

ON-DIE TERMINATION OF ADDRESS AND COMMAND SIGNALS

RELATED APPLICATIONS

This application is a continuation of U.S. application Ser. No. 16/716,385, filed Dec. 16, 2019, which is a continuation of U.S. application Ser. No. 16/174,180, filed Oct. 29, 2018, now U.S. Pat. No. 10,510,388, which is a continuation of U.S. application Ser. No. 15/665,304, filed Jul. 31, 2017, now U.S. Pat. No. 10,115,439, which is a continuation of U.S. application Ser. No. 15/394,009, filed Dec. 29, 2016, now U.S. Pat. No. 9,721,629, which is a continuation of Ser. No. 15/081,745, filed Mar. 25, 2016, now U.S. Pat. No. 9,570,129, which is a continuation of U.S. application Ser. No. 14/613,270, filed Feb. 3, 2015, now U.S. Pat. No. 9,299,407, which is a continuation of U.S. application Ser. No. 14/088,277, filed Nov. 22, 2013, now U.S. Pat. No. 8,947,962, which is a continuation of U.S. application Ser. No. 12/519,908, filed Jun. 18, 2009, now U.S. Pat. No. 8,599,631, which is a U.S. National stage application filed under 35 U.S.C. § 371 of PCT Patent Application Serial No. PCT/US2007/088245, filed Dec. 19, 2007, which claims the benefit of and priority to U.S. Provisional Application Ser. No. 60/876,672, filed Dec. 21, 2006, all of which are incorporated herein by reference in their entirety.

TECHNICAL FIELD

This disclosure relates generally to the field of semiconductor memories and memory systems.

BACKGROUND

High-speed, readily-expandable memory systems consisting of groups of memory devices or modules are commonly used to store data in computers and other electronic devices. Bits of data are typically stored in semiconductor memory cells on the memory device, with the data being transmitted along data signals lines or data bus connected to the memory modules. To avoid undesirable signal reflections on the data bus, the memory device typically includes some sort of termination circuitry for the data bus lines.

So-called "fly-by" memory modules topologies are being increasingly used for DRAM memory module applications. "Fly-by" memory modules can be terminated either at the hosting motherboard or at the module itself. This scheme often uses extra printed circuit board (PCB) area devoted to termination of the command, address, and control signals (i.e., "RQ" signal or bus lines) on each module in the system, resulting in less area being available for DRAM packages. Also typical memory systems expend significant power for the command, address, and control signals.

BRIEF DESCRIPTION OF THE DRAWINGS

The present invention will be understood more fully from the detailed description that follows and from the accompanying drawings, which however, should not be taken to limit the invention to the specific embodiments shown, but are for explanation and understanding only.

DETAILED DESCRIPTION

In the following description specific details are set forth, such as device types, system and circuit configurations, component values, signaling methods, etc., in order to provide a thorough understanding of the disclosure herein. However, persons having ordinary skill in the relevant arts will appreciate that these specific details may not be needed to practice the embodiments described.

In the context of the present application, a memory "module" refers to an assembly of memory chips or devices (i.e., semiconductor dies) arranged on a substrate or printed circuit board (PCB) in association with a memory system. A memory module may thus be considered a memory subsystem. The term "data bus" is used throughout to denote data (DQ) signal lines, timing reference signals, and data masking control bits (DM) by which data is communicated to one or more memory modules. Similarly, the term "address/command bus" is used herein to denote the signal lines that carry command, address and control (RQ or CAC) information for communications between a memory controller and one or more memory modules. The term "memory controller", as used herein, refers to a broad class of generic and application-specific processing devices that are capable of reading data from, and writing data to, one or more memory modules.

In accordance with one embodiment, each memory device or module of a memory system arranged in a fly-by connection topology includes ODT circuitry for selectively terminating one or more of the RQ signal lines. The RQ signals comprise the command, address, control, and clock signals that may be used to write data to the individual memory cells of the modules, and also to read data stored therein. In a typical configuration, the last device of every module connected to the RQ bus has one or more RQ lines terminated by connecting an ODT enable pin to the appropriate voltage supply rail of the device or module.

Other embodiments may also utilize register control, either as an override, or as a replacement, for the enable pin configuration method. For example, in one embodiment register fields may be utilized to override the RQ ODT enable. In a specific implementation, a register bit may allow the clock lines to be discretely terminated on the device or module, while the RQ signals (or a subset thereof) are terminated with ODT circuitry.

Figure 1:
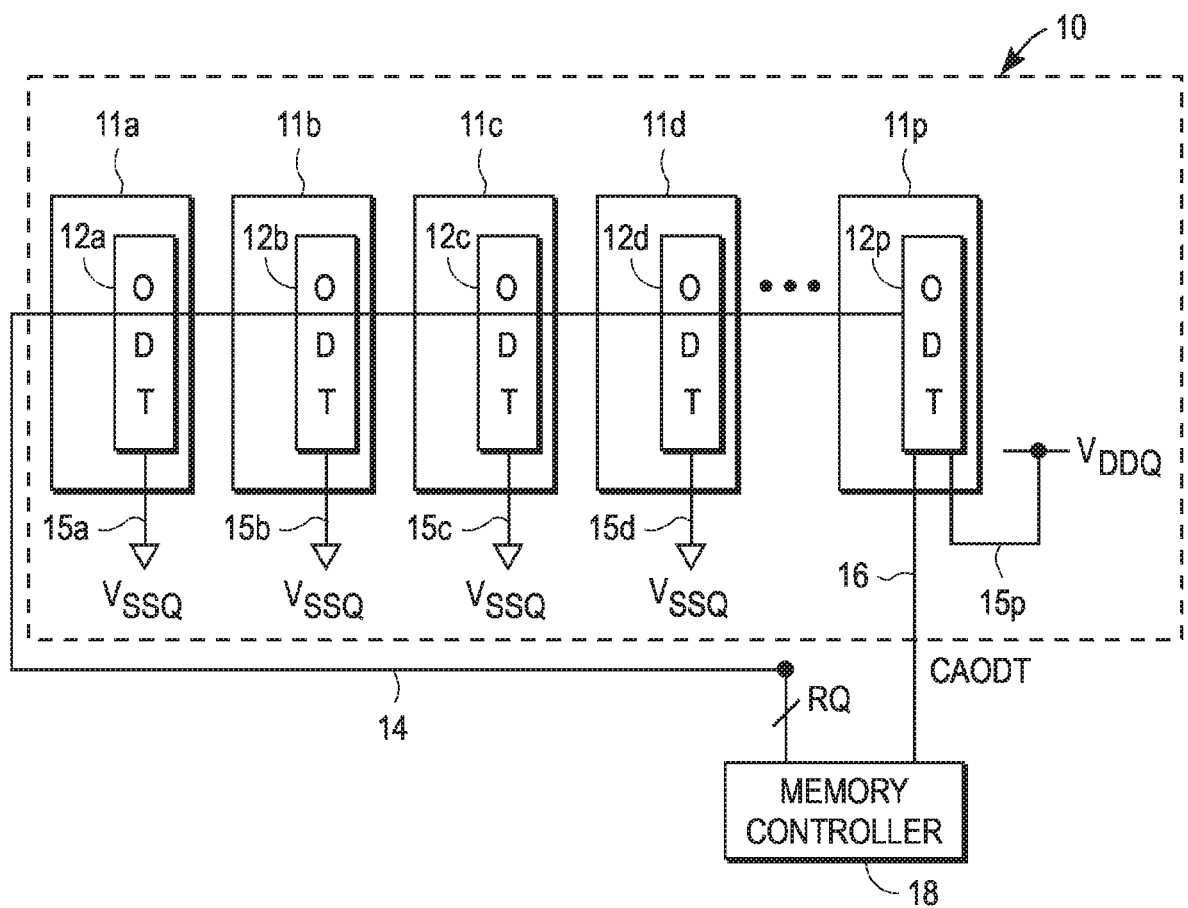
FIG. 1 illustrates an example memory system with memory devices that employ ODT circuitry.

FIG. 1 illustrates an example memory module 10 comprising a plurality of DDR3 memory devices 11 arranged in a fly-by (also known as a multi-drop) connection topology, each of the memory devices comprising a single semiconductor chip or die that includes ODT circuitry 12. For example, FIG. 1 shows 16 memory devices 11a-p, each with a respective ODT circuit 12a-p that may be utilized to selectively terminate any or all of the RQ signal lines on RQ bus 14. Each of memory devices 11 also includes an ODT termination pin 15, which is tied to either VDDQ or VSSQ in the module layout, depending on the device's location on RQ bus 14. By way of example, FIG. 1 illustrates ODT circuit 12p of the last memory device (i.e., device 11p) on RQ bus 14 being enabled by connection of ODT termination pin 15*p* to the positive voltage supply rail, VDDQ. The remaining ODT circuits 12*a-o* are shown having their respective ODT termination pins 15*a-o* connected to the negative voltage supply rail, VSSQ, which disables termination on devices 11*a-o*.

It is appreciated that the last device (i.e., device 11*p*) is the one electrically furthest from the memory controller 18. In the fly-by (or multi-drop) connection topology, each control and address (CA) signal is routed from a controller pin to a pin on each DRAM device. The propagation time from the controller to each memory device is different depending on the physical position of the memory device in the module. In the example of FIG. 1, device 11*p* is the last memory device in the topology, and therefore experiences the longest CA signal propagation time. It is appreciated that chip select (CS) signals may also be routed with the same fly-by connection topology as the CA signals in the example memory module of FIG. 1.

Memory controller 18 is shown driving the signal lines of bus 14, as well as driving a control/address ODT signal line 16 (labeled "CAODT") connected to ODT circuit 12*p*. The CAODT control signal pin may be utilized to actively enable and disable a subset (or all) of the RQ signal line terminations. For instance, CAODT pin 16 may be actively driven by memory controller 18 to enable or disable ODT circuit 12*p* at certain times depending on the transactions been performed in memory system 10. By way of example, when memory controller 18 drives CAODT pin 16 to a logical high level (e.g., VDDQ), ODT circuit 12*p* is enabled or turned on, such that the impedance for a subset (or all) of the signals at the end of RQ bus 14 is set to a predetermined value. The timing for enabling and disabling the ODT circuitry on the RQ signal lines may be the same is that for the data group signal lines.

Practitioners in the art will appreciate that the impedance value of the termination may be determined by signal integrity studies, and may be different for different "classes" of signals. For example, the chip select signal lines may have a different impedance value as compared to the address signal lines. In the case where memory controller 18 drives CAODT pin 16 to a logical low level (e.g., VSSQ), ODT circuit 12*p* is disabled or turned off, e.g., a high impedance value for the signal lines terminating at the end of RQ bus 14. It should be further understood that CAODT signal line 16 may be included on RQ bus 14.

In one embodiment, a subset of the RQ signals is terminated at all times by ODT circuit 12*p* in device 11*p*. The RQ signals that are terminated at all times include the external clock signals (CK/CKN) and the chip reset signal (RESETN). In the example of FIG. 1, the subset of the RQ signals on bus 14 that are not terminated, unless memory locations in device 11*p* are being immediately addressed, include the address lines (A[15:0]); bank address (BA[2:0]); chip select (CS[3:0]); clock enable (CKE); row address strobe (RASN); column address strobe (CASN); and write enable (WEN). The termination circuits for these latter signal lines may be dynamically controlled by CAODT pin 16. In other words, the foregoing subset of signal lines may be dynamically controlled such that the impedance value at the end of the RQ bus for these signals depends upon the operations being performed. Termination is normally disabled for non-addressed devices.

Practitioners in the art will appreciate that dynamically controlling (enabling/disabling) the termination at the end of the RQ bus for a subset of signal provides a significant power saving advantage. In one implementation, for example, disabling the termination on most of the RQ pins during extended idle times on the RQ bus, or while in a power-down mode, may save about 300 mW per memory device.

Figure 2A:
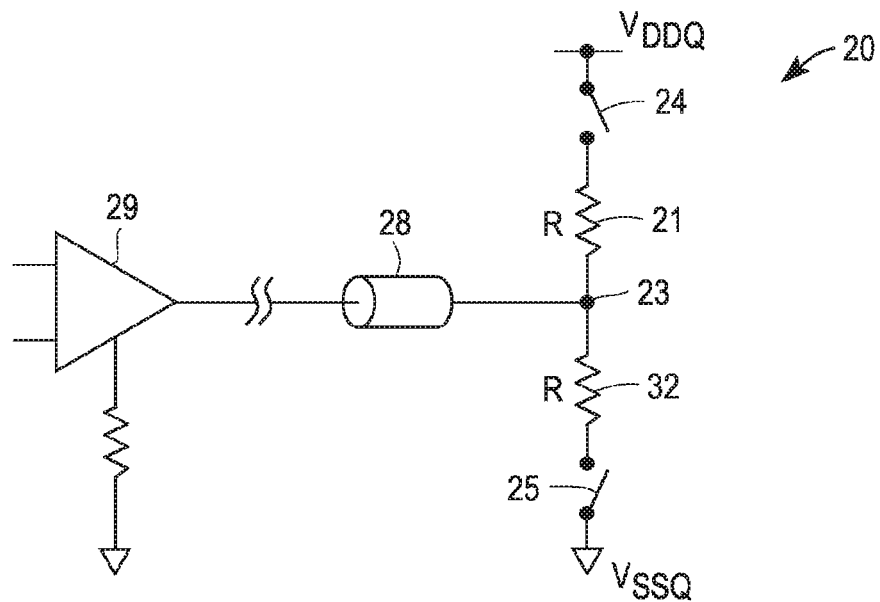
FIGS. 2A and 2B are example ODT circuits that may be used in the memory system of FIG. 1.

FIG. 2A illustrates an example ODT circuit 20 that may be used in the memory system of FIG. 1. ODT circuit 20 comprises a switch 24 coupled in series with resistor 21 between positive voltage supply rail VDDQ and signal line termination node 23. Similarly, a resistor 32 and switch 25 are coupled in series between node 23 and negative supply voltage rail VSSQ. (It is appreciated that switches 24 & 25 may also be located between node 23 and respective resistors 21 & 32.) The signal line has a characteristic impedance shown by element 28 driven by a driver 29 associated with the memory controller. Both resistors 21 and 32 are shown having the same resistance value, R, such that when both switches 24 & 25 are closed the equivalent resistance terminating the signal line is R/2, with the voltage at node 23 being (VDDQ-VSSQ)/2. With switches 24 & 25 both open, termination is off (e.g., high impedance). Consistent with the example of FIG. 1, switches 24 & 25 may both be simultaneously controlled by CAODT pin 16.

Figure 2B:
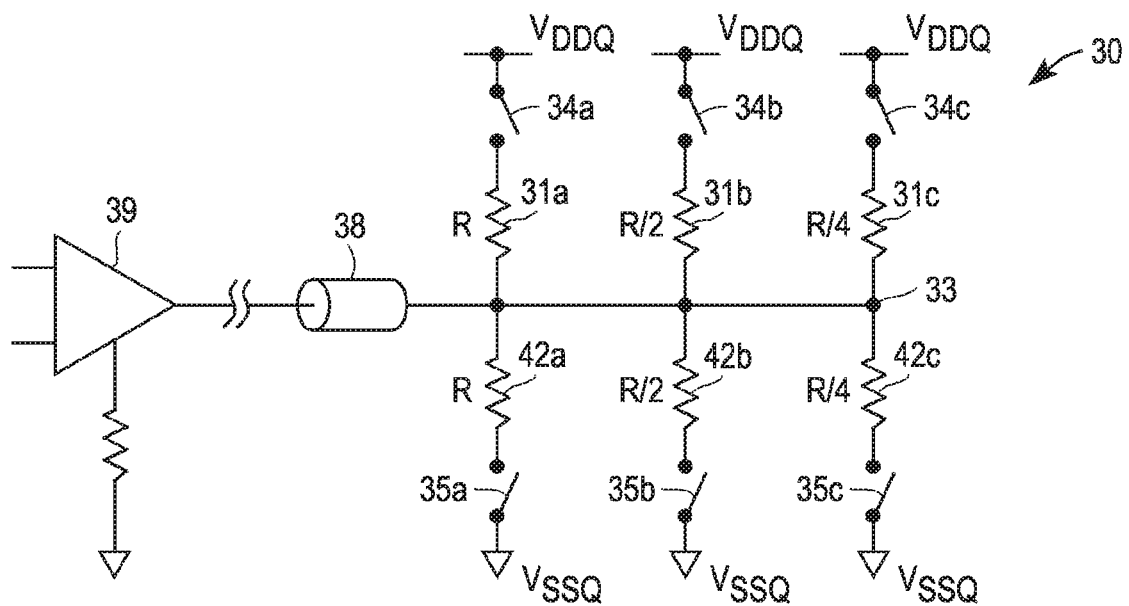

FIG. 2B illustrates another example ODT circuit 30 that may be used in the memory system of FIG. 1 to achieve dynamic termination with multiple impedance values. ODT circuit 30 resembles the ODT circuit of FIG. 2A, except with three parallel arranged circuit legs. Each leg comprises a switch 34 coupled in series with a resistor 31 between VDDQ and signal line termination node 33. Each leg also includes a resistor 42 and switch 35 coupled in series between node 33 and VSSQ. Resistors 31*a* & 42*a* have a resistance R; resistors 31*b* & 42*b* have a resistance R/2; and resistors 31*c* & 42*c* have a resistance R/4.

Switches 34 and 35 of may be selectively opened/closed in order to implement various different termination impedance values applied to different command, control, and address signals of selected memory devices. For instance, in one embodiment, the termination impedance of a signal line may be selected to be "strong" by closing of all of switches 34 & 35, "weak" by closing only switches 34*a*, 34*b*, 35*a* and 35*b*, or "off" by leaving all of switches 34 & 35 open, depending on signal integrity considerations. In the example of FIG. 2B the characteristic impedance is shown by element 38, with the signal line being driven by a driver 39 associated with the memory controller. Switches 34 & 35 in each leg may both be simultaneously controlled by a different CAODT pin or bit value in a register field.

In a specific embodiment, multi-value RQ termination is supported for memory device by selecting different values of address, control, and command signal line termination impedance to be employed. For instance, multi-value RQ termination may be controlled by three different register fields. A first register field may be used to set an alternate value of termination to be used, while a second register field determines how the alternate value is enabled. A third register field may be used to set a nominal impedance to be used for termination. According to one method of control, the CAODT control pin selects the nominal value of impedance when driven high, and the alternate value of impedance when driven low.

Figures 4, 5:
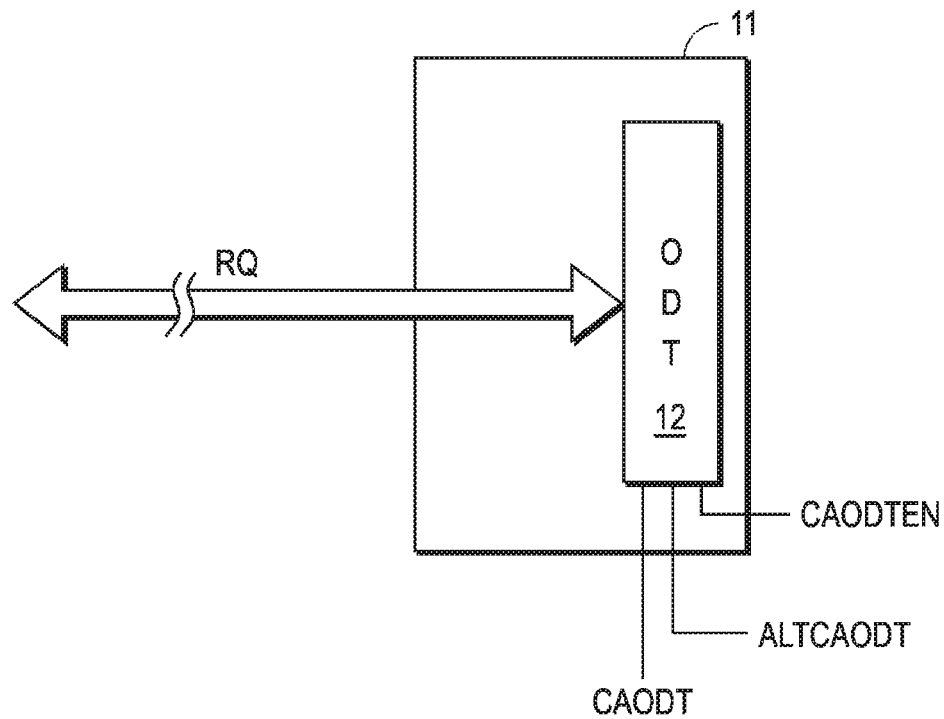
FIG. 4 illustrates an example memory module with ODT circuitry that provides multiple termination impedance values.
FIG. 5 is a table that illustrates example termination impedance values corresponding to various input pin logic levels for the memory module shown in FIG. 4.

A second method of controlling/selecting multiple termination values for an RQ signal line utilizes the CAODT control pin and an ALTCAODT control pin. FIG. 4 illustrates an example memory device 11 with ODT circuitry 12 that provides for multiple termination impedance values using the CAODT and ALTCAODT control pins. FIG. 5 is a table that illustrates example termination impedance values corresponding to various input pin logic levels for the memory device shown in FIG. 4. As can be seen, when CAODTEN is high (enabled), a logical high value applied to the CAODT control pin enables a nominal impedance value. On the other hand, when ALTCAODT is high, the alternate impedance value is enabled. When CAODTEN and ALT-CAODT are both low, termination is off (i.e., a high impedance state).

It is appreciated that in another embodiment the CAODTEN pin may be controlled via a configuration bit. Setting of the configuration bit to "1", for example, may be equivalent to statically enabling the address on the termination, i.e., hard-tying the CAODTEN pin high.

Figure 3:
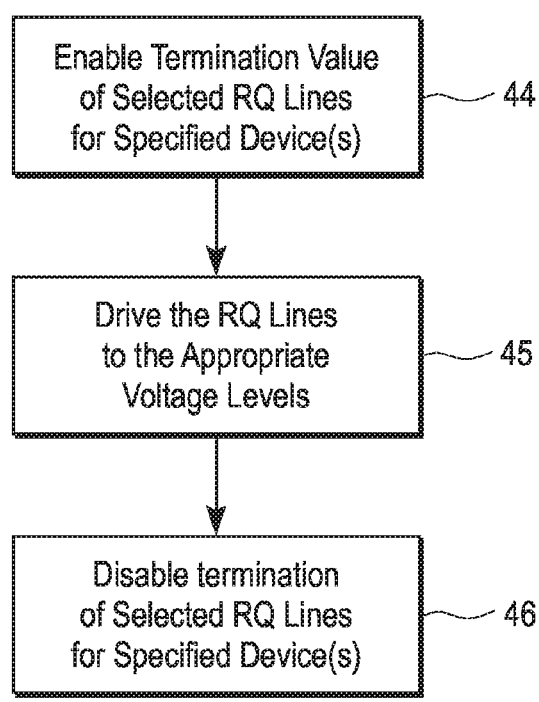
FIG. 3 illustrates an example method of operation for the memory system of FIG. 1.

FIG. 3 illustrates an example method of operation for the memory system of FIG. 1. The process begins at block 44, wherein prior to addressing a selected memory device the termination value of selected RQ lines is enabled for the selected memory device. It is appreciated that, in certain situations, termination values may be enabled for more than one device. For instance, depending where the addressed device is electrically located on the RQ bus, it may be appropriate to disable termination on the addressed device, while simultaneously enabling termination on an adjacent device, in order to achieve optimal signal integrity. In other words, termination of the individual RQ signal lines may be dynamically controlled by the memory controller rather than being statically enabled. Furthermore, in certain cases, termination may specifically be disabled in instances where the terminated device is being addressed and enabled when it is not being addressed. In still other situations, termination may be enabled except during full bus idle conditions or power down states. In other embodiments, each of the memory devices arranged in the fly-by topology may have termination enabled with respect to the RQ signal lines, with the termination impedance value changing during addressing of specific devices.

Once the appropriate termination values have been applied to a subset (or all) of RQ signal lines on the selected memory device(s), the RQ lines may be driven to the appropriate voltage levels for addressing the memory locations within the device (block 45). After data has been written/read from the addressed location, termination is disabled for the subset of RQ lines at the specified device(s) (block 46). As discussed previously, disabling termination has the salutary effect of reducing quiescent power consumption in the memory system.

Figure 6:
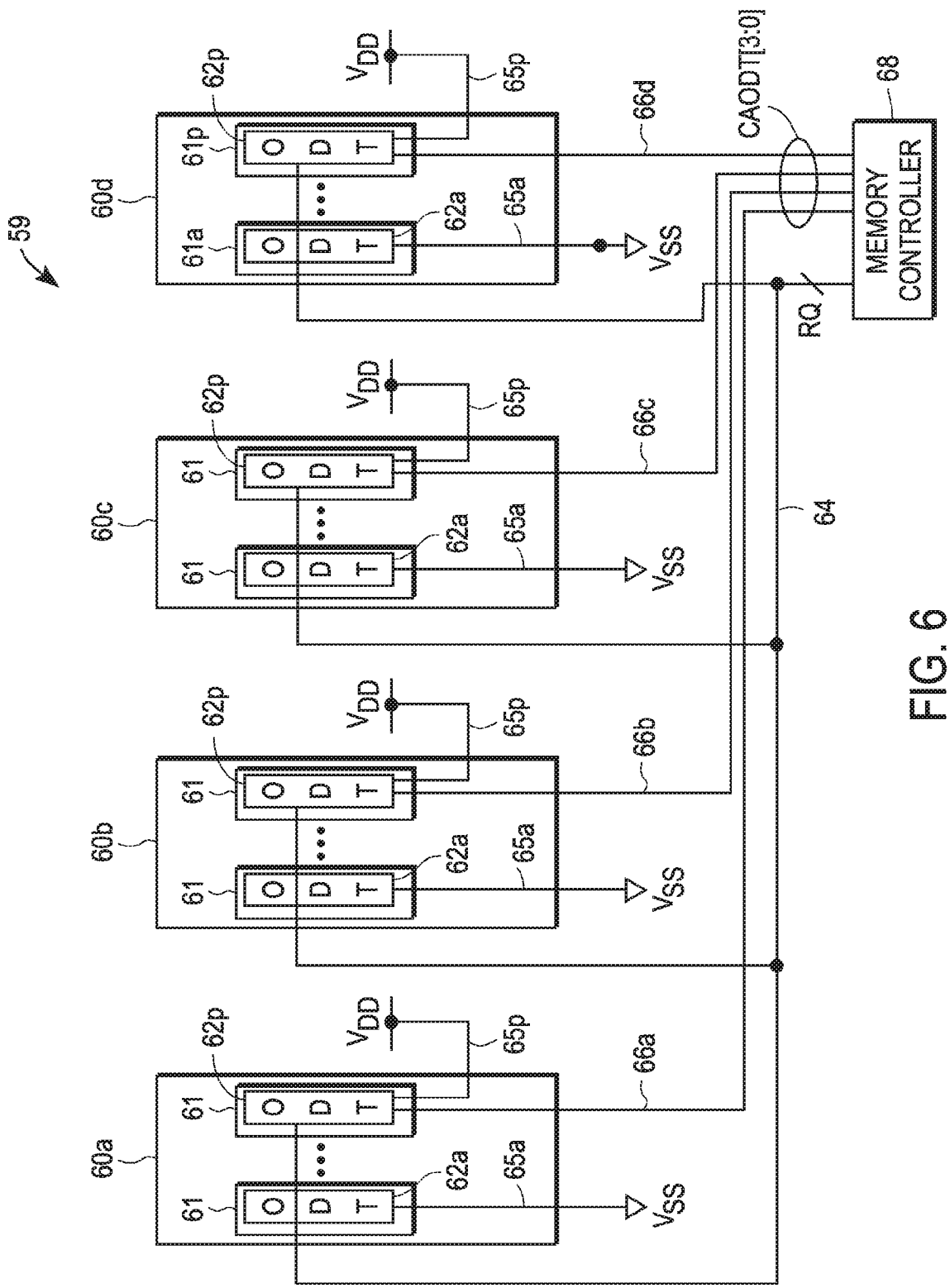
FIG. 6 illustrates another example memory system with memory modules that employ ODT circuitry.

FIG. 6 illustrates another example memory system 59 with four memory modules 60a-60d, each module comprising a plurality of memory devices (e.g., DRAM chips) 61. Each of the memory devices 61 include ODT circuitry 62, with each of the memory devices of the modules being coupled with a memory controller 68. As in the case of the example of FIG. 1, the respective ODT circuits 62 of memory devices 61 may be utilized to selectively terminate any or all of the RQ signal lines on RQ bus 64. In this example, the RQ bus lines are shown coupled with the memory devices of each module in a stub bus connection topology. In the stub bus connection topology the RQ lines are routed to each module by splitting off of a main bus. In this embodiment, the RQ signals are split off of the main bus and then routed onto each individual module. After being routed past each individual DRAM in a "fly-by" topology, the RQ signals are then optionally terminated by the memory device farthest (electrically) from the controller.

Each of memory devices 61 of each module 60 also includes an ODT termination on/off pin 65, which is tied to either VDD or VSS in the module layout, depending on the location of the device in the module. Tying termination pin 65 to VDD enables termination for that device. Conversely, tying pin 65 low to VSS disables termination at that device. In the example of FIG. 6, only the ODT circuit 62p of the last memory device 61p in each memory module 60 is enabled by connection of ODT termination pin 65p to the positive voltage supply rail, VDD. The remaining ODT circuits 62a-o of the other memory devices 61 on each of modules 60a-60d have their respective ODT termination pins 65 connected to the negative voltage supply rail, VSS, which disables termination on those devices.

A termination impedance value for each device 61p of modules 60a-60d may be selected via CAODT pins 66a-66d, respectively. For example, the ODT circuitry may be configured such that raising CAODT pin 66 to a high voltage potential (logical "1") result in a nominal termination impedance, whereas lowering pin 66 to a logical "0" voltage produces an alternate (or high) impedance at that device. Multiple CAODT pins (e.g., CAODT & ALTCAODT) for each device may be utilized for setting a variety of different termination impedance values at devices 62p.

In the same manner as described in conjunction with FIG. 1, memory controller 68 may be utilized to actively drive all, or a subset, of the RQ signal lines of bus 64, as well as driving CAODT signal lines 66a-66d connected to ODT circuits 62p of respective modules 60a-60d. CAODT pin 66 may thus be used to selectively enable or disable ODT circuit 61p of a selected module at certain times depending on the transactions being performed in memory system 59. For example, when a write transaction is initiated to module 60d, the termination on modules 60a-c may be enabled to eliminate reflections from those trace stubs. The termination on module 60d may remain disabled in order to allow a full signal swing on that module. Similarly, where the termination circuitry on devices 61 supports multiple values of termination impedance, a write operation to module 60d may be best achieved having a "strong" termination enabled in modules 60a-c (e.g. low impedance) while module 60d has a "weak" termination (e.g. higher impedance) enabled. In another example, the termination on module 60d may be enabled on a write to module 60d, while the terminations on all other modules are disabled. In still another example, a write to module 60d may be best achieved by having modules 60a-c "weakly" terminated (e.g. high impedance), while enabling a "strong" termination (e.g. lower impedance) on module 60d.

In another embodiment, termination of the last device of each of a plurality of memory modules may be implemented utilizing a termination component device (or several devices) separate from the memory chips and actively controlled by memory controller 68.

It is also appreciated that the foregoing termination examples are applicable to buffered memory systems configured with a single buffer on each module or multiple buffers paired with one or more memory devices in a fly-by fashion.

In still another embodiment, instead of employing the "stub bus" routing scheme shown in FIG. 6, a "serpentine" routing scheme may be used in which the address lines are routed onto and off of each module in turn. In this latter connection topology, only the ODT circuit of the last memory device of the last memory module is enabled.

It should be understood that elements of the present invention may also be provided as a computer program product which may include a machine-readable medium having stored thereon instructions which may be used to program a computer (e.g., a processor or other electronic device) to perform a sequence of operations. Alternatively, the operations may be performed by a combination of hardware and software. The machine-readable medium may include, but is not limited to, floppy diskettes, optical disks, CD-ROMs, and magneto-optical disks, ROMs, RAMs, EPROMs, EEPROMs, magnet or optical cards, propagation media or other type of media/machine-readable medium suitable for storing electronic instructions. For example, elements of the present invention may be downloaded as a computer program product, wherein the program may be transferred from a remote computer or telephonic device to a requesting process by way of data signals embodied in a carrier wave or other propagation medium via a communication link (e.g., a modem or network connection).

Additionally, although the present invention has been described in conjunction with specific embodiments, numerous modifications and alterations are well within the scope of the present invention. Accordingly, the specification and drawings are to be regarded in an illustrative rather than a restrictive sense.

We claim:

1. A method of operating a memory controller to control one or more memory devices via a command/address (CA) bus, wherein each of the memory devices has a chip select input connected to a respective signal line of the CA bus; the method comprising:
   sending, to respective inputs of the one or more memory devices, command/address (CA) signals, including a chip select signal to each respective chip select input of the memory devices; and
   sending to each respective memory device of the memory devices:
      register values, for storage in a plurality of registers, wherein the register values represent one or more impedance values of on-die termination (ODT) impedances to apply to the respective inputs of the respective memory device that receive the CA signals, and one or more register values to selectively enable application of a chip select ODT impedance to each respective chip select input.

2. The method of claim 1, wherein
   each of the memory devices has a second input to receive a clock signal; and
   the register values sent by the memory controller to each respective memory device include one or more register values to selectively enable application of a clock signal ODT impedance to the second input of the respective memory device.

3. The method of claim 2, wherein the register values sent by the memory controller to each respective memory device include one or more register values to specify an impedance value of the clock signal ODT impedance to be applied to the second input of each respective memory device.

4. The method of claim 2, further comprising sending an ODT enable signal, having one of a first voltage and second voltage, to a third input of each of the memory devices;
   wherein each of the memory devices is configured to enable application of respective ODT impedances to the respective inputs, of the memory devices, that receive the CA signals, in response to the ODT enable signal having the first voltage, and to disable application of the respective ODT impedances to the respective inputs, of the memory devices, that receive the CA signals in response to the ODT enable signal having the second voltage.

5. The method of claim 4, wherein the register values sent by the memory controller to the respective memory device include an override register value that specifies an override of the ODT enable signal.

6. The method of claim 5, wherein a first setting of the override register value sent by the memory controller to the respective memory device enables application of the respective ODT impedances to the respective inputs of the respective memory device in response to the ODT enable signal and a second setting of the override register value sent by the memory controller to the respective memory device causes the respective memory device to ignore the ODT enable signal.

7. The method of claim 1, wherein the register values sent by the memory controller to each respective memory device include one or more register values to specify an impedance value of the chip select ODT impedance to be applied to the chip select input of each respective memory device.

8. The method of claim 7, wherein each respective memory device includes address line inputs to receive address signals sent by the memory controller via the CA bus, and the register values sent by the memory controller to each respective memory device include one or more register values to specify a first ODT impedance value to be applied to the address line inputs of each respective memory device.

9. The method of claim 8, wherein the register values sent by the memory controller to each respective memory device include one or more register values to specify an alternative ODT impedance value, different from the first ODT impedance value, to be applied to address line inputs of each respective memory device.

10. The method of claim 9, wherein the register values sent by the memory controller to the respective memory device include a register value to specify how use of the alternative ODT impedance value for on die termination of address line inputs of the respective memory device is enabled.

11. The method of claim 1, wherein the register values sent by the memory controller for storage in the plurality of registers of the respective memory device include one or more register values to selectively enable application of the ODT impedances to the respective inputs that receive the CA signals.

12. A method of operating a memory controller to control one or more memory devices via an command and address (CA) bus, the method comprising:
   sending, to respective inputs of a respective memory device of the memory devices, command and address information via the CA bus; and
   sending, to each respective memory device, register values for storage in register fields, wherein the register values include register values to specify one or more impedance values of ODT impedances, and one or more register values to selectively enable application of a clock signal ODT impedance to at least one clock input of the respective memory device.

13. The method of claim 12, wherein the register values include one or more register values to selectively enable application of the ODT impedances to the respective inputs that receive the command and address information.

14. The method of claim 12, wherein
   each of the memory devices has a second input to receive a clock signal; and
   the register values sent by the memory controller to each respective memory device include one or more register values to selectively enable application of a clock signal ODT impedance to the second input of the respective memory device.

15. The method of claim 14, further comprising sending an ODT enable signal, having one of a first voltage and second voltage, to a third input of each of the memory devices;
    wherein each of the memory devices is configured to enable application of respective ODT impedances to the respective inputs, of the memory devices, that receive command and address information via the CA bus, in response to the ODT enable signal having the first voltage, and to disable application of the respective ODT impedances to the respective inputs, of the memory devices, that receive command and address information via the CA bus in response to the ODT enable signal having the second voltage.

16. The method of claim 14, wherein the register values sent by the memory controller to each respective memory device include one or more register values to specify an impedance value of the clock signal ODT impedance to be applied to the second input of the respective memory device.

17. The method of claim 12, wherein the register values sent by the memory controller to each respective memory device include one or more register values to specify a first ODT impedance value to be applied to address line inputs of the respective memory device.

18. The method of claim 17, wherein the register values sent by the memory controller to each respective memory device include one or more register values to specify an alternative ODT impedance value, different from the first ODT impedance value, to be applied to address line inputs of the respective memory device.

19. The method of claim 18, wherein the register values sent by the memory controller to the respective memory device include a register value to specify how use of the alternative ODT impedance value for on die termination of address line inputs of the respective memory device is enabled.

20. A memory controller to control the operation of one or more memory devices, the memory controller comprising:
    a command/address (CA) circuit to drive CA signals onto a CA bus; and
    a driver to drive a chip select signal onto the CA bus;
    the memory controller to:
        send, to respective inputs of the memory devices, command/address (CA) signals, including a chip select signal to each respective chip select input of the memory devices; and
        send to each respective memory device of the memory devices:
            register values, for storage in a plurality of registers, wherein the register values represent one or more impedance values of on-die termination (ODT) impedances to apply to the respective inputs of the respective memory device that receive the CA signals, and one or more register values to selectively enable application of a chip select ODT impedance to each respective chip select input;
    wherein the register values sent by the memory controller for storage in the plurality of registers of the respective memory device include one or more register values to selectively enable application of the ODT impedances to the respective inputs that receive the CA signals.

* * * * *